United States Patent [19]
Gottfried et al.

[11] 3,959,734
[45] May 25, 1976

[54] ELECTRON-BEAM-BOMBARDED, SEMICONDUCTOR, TRAVELING-WAVE DEVICE

[75] Inventors: Arthur H. Gottfried, Rumson; John J. Tancredi, Neptune, both of N.J.

[73] Assignee: The United States of America as represented by the Secretary of the Army, Washington, D.C.

[22] Filed: Aug. 14, 1975

[21] Appl. No.: 604,739

[52] U.S. Cl. .................................. 330/33; 315/3.5; 330/43
[51] Int. Cl.² ............................................. H03F 3/58
[58] Field of Search .................. 330/33, 43; 331/82; 315/3.5

[56] References Cited
UNITED STATES PATENTS
3,818,363  6/1974  Carter et al. .......................... 330/43

Primary Examiner—James B. Mullins
Attorney, Agent, or Firm—Nathan Edelberg; Robert P. Gibson; Frank Dynda

[57] ABSTRACT

A semiconductor is positioned as the anode of an electron tube, and is bombarded with a radio-frequency modulated stream of electrons. This bombardment produces carrier pairs in the semiconductor in a well known manner. However, in this case the carrier pairs are bunched, in the same manner as the modulating electrons, as they are drawn through the semiconductor by its bias voltage. A radio-frequency coil or meander line adjacent to the semiconductor interacts with the bunched carrier pairs traveling through the semiconductor — in the same manner as the radiofrequency coil of a traveling wave tube interacts with the electrons of a traveling wave tube, as they become bunched — to produce an amplified r-f signal in the coil.

9 Claims, 4 Drawing Figures

FIG. 1 (Prior Art)
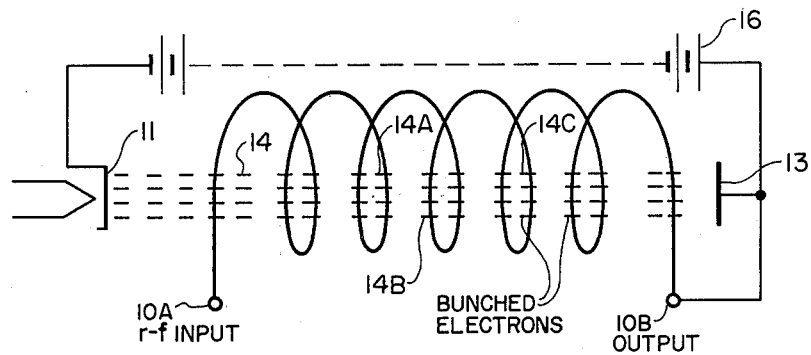
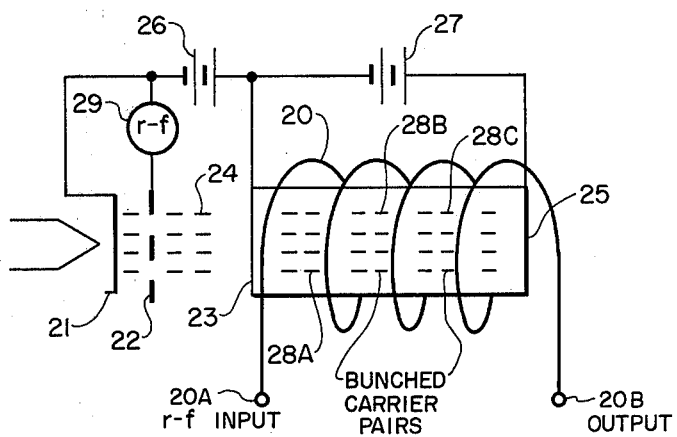
FIG. 2
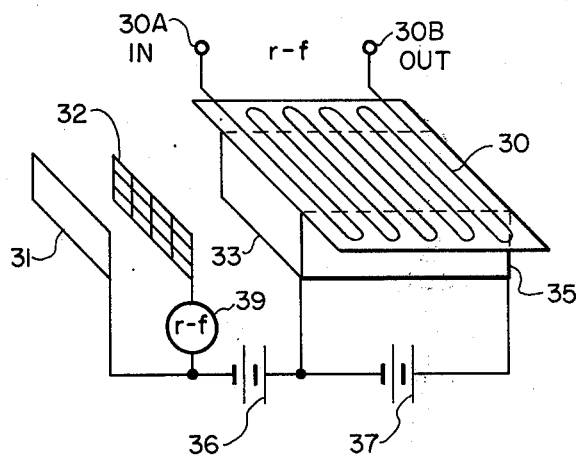
FIG. 3
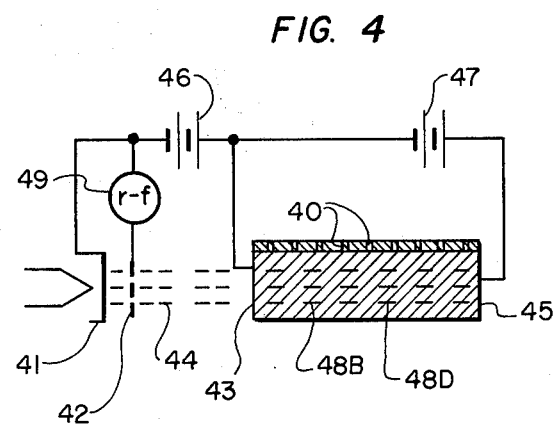
FIG. 4

ELECTRON-BEAM-BOMBARDED, SEMICONDUCTOR, TRAVELING-WAVE DEVICE

The invention described herein may be manufactured, used or licensed by or for the Government for governmental purposes without the payment of any royalties thereon.

BACKGROUND OF THE INVENTION

Electron tubes are, of course, very well known, and include the species of traveling wave tubes, in which a stream of electrons is focused or directed into an elongated beam that passes through a coil carrying r-f energy. The r-f energy in the coil interacts with the stream of electrons to cause bunching of the electrons along the stream. The bunches, in turn, interact with further turns of the coil to amplify the r-f energy in the coil.

Such traveling wave tubes are in very common use in the electronic world. However, they have the inevitable disadvantages of the bulk necessary to accommodate the elongated electron beam and the need for separate electrical or magnetic focusing system. Such a tube would also require a relatively high voltage between the cathode and anode to maintain the electron stream.

The search for small size, lightweight, high-efficiency, and high-reliability microwave devices turns to solid state devices, but these devices are currently limited, in peak and average power, at microwave frequencies. To overcome the peak power limitations of solid state devices, electron-beam semiconductor (EBS) devices are being developed. In those devices, a modulated electron beam strikes a semiconductor target comprising a reverse-biased p-n junction. Each incident electron striking the semiconductor produces thousands of carrier pairs in the junction region, with a correspondingly large current gain. The semiconductor is connected through an external, r-f, lumped output circuit to utilize this current gain.

The main limitation of the electron-beam semiconductor devices is the inevitable transit time through the semiconductor and the external circuit. Transit time effects and stray capacitance loading are such that there is an upper frequency limitation of approximately three gigahertz.

SUMMARY OF THE INVENTION

A semiconductor is connected with one end serving as the anode of an electron tube to be bombarded by electrons to produce carrier pairs in the semiconductor. The electron tube is r-f modulated in a well known manner to vary the density of electrons bombarding the semiconductor, and to vary the generation of the carrier pairs in the semiconductor. This produces a bunching of the carrier pairs in transit through the semiconductor that corresponds to the r-f modulation of the electron tube.

An r-f circuit, including a coil or meander line in the proximity of the semiconductor, adjusts the linear speed of an r-f wave to that of the transit speed of the carrier pairs in the semiconductor, to amplify the r-f wave in a manner similar to that of a traveling wave tube. This provides an amplifying device that is somewhat analogous to a traveling wave tube, but is very much smaller and lighter.

The effective stream or beam is confined to a semiconductor and does not need any focusing arrangement, and the beams are prebunched by the modulated electron beams and do not take any initial energy from the r-f circuit to initiate bunching, as in a traveling wave tube. The power supplies for the electronic as well as the semiconductor circuitry, are very much smaller, lighter, and lower in voltage than those required for a traveling-wave tube.

This invention also provides an electron-bombarded semiconductor device that does not connect directly through conventional, lumped, output circuits; that is relatively independent of transit time; and that is relatively unlimited in frequency response.

BRIEF DESCRIPTION OF THE DRAWINGS

FIG. 1 represents a typical traveling wave tube;
FIG. 2 represents the subject invention in a form similar to that of the traveling wave tube;
FIG. 3 shows another species of the invention; and
FIG. 4 shows a cross section of the species of FIG. 3.

DESCRIPTION OF THE PREFERRED EMBODIMENT

FIG. 1 shows some of the electrical and electronic portions of a typical traveling wave tube in simplified form. An r-f coil 10 has an input 10A and an output 10B. The coil surrounds the path of electrons through the tube, which has a cathode 11, and an anode 13, well known in the art. Dotted lines 14 are used to illustrate the flow of the electrons through the tube and suggest their bunching, at 14A, 14B, etc. as they pass through and interact with the r-f energy in the coil 10. A power supply 16 provides the electromotive force for the flow of electrons from the cathode to the anode.

FIG. 2 shows the subject invention in a similar format with similar elements similarly numbered. Here the electronic portion includes a cathode 21, and an anode surface or layer 23 connected across a power supply 26. A grid 22 modulates the flow of electrons, which are illustrated by the dotted lines 24, before they strike the anode 23.

The anode layer 23 is also one terminal of a semiconductor whose other terminal is 25. A helical coil 20 is looped about the semiconductor and has an input 20A and an output 20B. The bias or power supply 27 draws the carrier pairs through the semiconductor from the terminal 23 to the terminal 25. An r-f energy source 29 is connected to modulate the grid 22.

In operation, the electrons bombarding the anode and penetrating into the semiconductor produce carrier pairs, in a well known manner, proportional to the modulation of the electron stream. These carrier pairs are illustrated by the dotted lines that are in bunches 28A, 28B, etc. in accordance with the modulation of the electrons 24. These bunched carrier pairs passing through the r-f coil 20 produce a signal at the output of the r-f coil, corresponding to the frequency and the intensity of the bunches of the carrier pairs, in much the same manner as r-f energy is generated in a traveling wave tube.

FIG. 3 shows a variation of the basic concept, and here, again, similar elements are similarly numbered. A cathode 31, and anode 33 are connected to a power supply 36, and a grid 32 is modulated by an r-f energy source 39. The semiconductor has terminals 33 and 35, connected across a bias or power supply 37.

In this species the coil 30 is a meander line, rather than the helical coil, seen in FIGS. 1 and 2. This provides the same delay of the r-f signal, as in the coil, to synchronize it with the speed of the carrier pairs through the semiconductor.

FIG. 4 is a cross section of the species of FIG. 3, with dotted lines 48B and 48D, for example, to illustrate the probable bunching of the carrier pairs, passing through the semicoductor. The other elements of FIG. 4 correspond to those of the other figures and are similarly marked. A cathode 41, anode 43, and power supply 46 produces a stream of electrons that are represented by the dotted lines 44. A grid 42 and an r-f modulating source 49 are provided to modulate the stream of electrons. The semiconductor terminals 43 and 45 are across the bias power supply 47, to draw the bunched carrier pairs through the semiconductor. The meander line appears in cross section as the conductors 40.

In operation, as noted earlier, the electrons from the cathode 41, for example, are modulated by the source of r-f energy 49 applied to the grid 42 to form bunches of electrons 44. These strike the anode layer 43 which is also one terminal of the semiconductor. The bunches of electrons produce corresponding bunches of carrier pairs 48B, 48D, etc. that are drawn through the semiconductor, by the bias supply 47, to the other terminal 45 of the semiconductor.

The coils or turns of an r-f circuit are designed or spaced to correspond to the frequency of the modulation of the bunched pairs. The bunched carrier pairs produce the same effect in the line 40 of the r-f circuit as is produced in the coils 10 of a traveling wave tube.

Typical r-f coils such as are used in traveling wave tubes would be applicable here, although they would be scaled down physically to the size of the semiconductor, and the frequencies involved.

The meander line shown here, and any variations that would have the same effect as the r-f coils would also be applicable. Again, they would have to be adapted to the sizes and dimensions involved. These meander lines could be on one or both sides of the semiconductor.

These meander lines would lend themselves to microcircuit techniques for ease and accuracy of construction. They could, under some conditions be applied directly to a layer on the surface of the semiconductor, or they could be applied to a separate substrate.

These lines need not be limited to the size of the semiconductor, as shown in FIG. 3, for example. This variation in the relative sizes of coil and semiconductor would make it possible to reduce the width and thickness of the semiconductor without changing the frequency characteristics of the coil.

The power supplies for the electronic circuit as well as for the semiconductor circuit would be typical for the currents involved and the spacings between electrodes.

The control grid of the electronic portion of this device would be typical of grids well known in vacuum tube technology, and would produce modulation of the electron beam in a well known manner. Other forms of modulation, such as deflection of the electron beam may also be used here, and may provide modulation at even higher frequencies.

The frequency of operation of this device is not limited by the transit time of the semiconductors, as in other circuits. The frequency can be chosen for given coils and conditions. The coils will normally be designed to synchronize the axial speed of the r-f wave with the linear speed of the carrier pair bunches.

Other lumped circuits, not shown, may be added to both the semiconductor circuit, and to the r-f circuit in a well known manner to supplement each other, and, possibly, to increase efficiency.

What is claimed is:

1. An electron-bombarded semiconductor device comprising:
   a semiconductor having opposing ends;
   means for bombarding one end of said semiconductor with a stream of electrons to produce carrier pairs within said semiconductor proportional to said bombarding electrons;
   means for modulating said stream of electrons bombarding said semiconductor to modulate said carrier pairs;
   means for drawing said modulated carrier pairs along an axis of said semiconductor from said one end to the other end at a given rate;
   conducting means positioned adjacent to said semiconductor, said conducting means being wound to progress uniformly in the direction of said axis of said semiconductor;
   an output circuit; and
   means for connecting said output circuit to one end of said conducting means, whereby said bunched carrier pairs traveling along said axis of said semiconductor will induce signals in said conductor that travel in the direction of said axis of said semiconductor at said given rate.

2. An electron-bombarded semiconductor device as in claim 1 wherein said means for bombarding said one end of said semiconductor with a stream of electrons comprises an electronic portion of said device having a cathode, an anode, and a power supply connected between said cathode and said anode.

3. An electron-bombarded semiconductor device as in claim 2 wherein said means for modulating said stream of electrons comprises a grid, and a means including a source of r-f energy, for connecting said grid to said cathode.

4. An electron-bombarded semiconductor device as in claim 1 wherein said means for drawing said modulated carrier pairs along said axis of semiconductor from said one end to said other end comprises a bias power supply connected between said one end and said other end of said semiconductor.

5. An electron-bombarded semiconductor device as in claim 1 wherein said conducting means comprises a coil of wire wound uniformly around said semiconductor in the direction of said axis of said semiconductor, said coil of wire having an input terminal adjacent to said one end of said semiconductor; an output terminal adjacent to said other end of said semiconductor; and means for connecting said output circuit to said output terminal of said coil.

6. An electron-bombarded semiconductor device as in claim 1 wherein said conducting means comprises at least one meander line positioned adjacent to said semiconductor, parallel to said axis, and having a conductor wound back and forth with uniform spacing along said axis; said meander line having an input terminal adjacent to said one end of said semiconductor and an output terminal adjacent to said other end of said semiconductor; and means for connecting said output circuit to said output terminal of said meander line.

7. An electron-bombarded semiconductor device as in claim 6 wherein said meander line is deposited on at least one surface of said semiconductor between said one end and said other end.

8. An electron-bombarded semiconductor device as in claim 6 wherein said meander line is deposited on a separate substrate and said separate substrate is positioned along one surface of said semiconductor parallel to said axis.

9. An electron-bombarded semiconductor device as in claim 8 wherein said separate substrate is substantially larger than the width or thickness of said semiconductor, and said meander line conductor windings extend beyond said semiconductor.

* * * * *